United States Patent [19]
Komoda

[11] Patent Number: 5,438,524
[45] Date of Patent: Aug. 1, 1995

[54] LOGIC SYNTHESIZER

[75] Inventor: Michio Komoda, Itami, Japan

[73] Assignee: Mitsubishi Denki Kabushiki Kaisha, Tokyo, Japan

[21] Appl. No.: 100,992

[22] Filed: Aug. 3, 1993

[30] Foreign Application Priority Data

Sep. 1, 1992 [JP] Japan .................. 4-233466

[51] Int. Cl.$^6$ ............................................. G06F 17/50
[52] U.S. Cl. .................................. 364/489; 364/491
[58] Field of Search ............... 364/488, 489, 490, 491

[56] References Cited

U.S. PATENT DOCUMENTS

| | | | |
|---|---|---|---|
| 4,701,860 | 10/1987 | Mader | 364/490 |
| 4,918,614 | 4/1990 | Modarres et al. | 364/490 |
| 4,960,724 | 10/1990 | Watanabe et al. | 437/51 |
| 5,121,336 | 6/1992 | Chang | 364/491 |
| 5,187,671 | 2/1993 | Cobb | 364/490 |
| 5,222,030 | 6/1993 | Dangelo et al. | 364/489 |
| 5,231,590 | 7/1993 | Kumar et al. | 364/491 |
| 5,278,769 | 1/1994 | Bair et al. | 364/490 |

OTHER PUBLICATIONS

Proceedings of the IEEE 1989 Custom Integrated Circuits Conference, San Diego, Calif., May 15–18, 1989, Ken Takeya et al, "Generator for High-Density Macrocells with Hierarchical Structure".

Primary Examiner—Kevin J. Teska
Assistant Examiner—Susan Wieland
Attorney, Agent, or Firm—Oblon, Spivak, McClelland, Maier & Neustadt

[57] ABSTRACT

An object of the present invention is to obtain a logic synthesizer for generating a net list according to which a layout procedure is simplified. A layout simplifying unit is provided in a stage succeeding to a timing regulating unit. The layout simplifying unit takes in a net list produced by the timing regulating unit and then evaluates a layout aptitude of the net list. If the layout aptitude is NO GOOD, a macro cell replacing process is performed with reference to macro cells registered in a macro cell library, to change the net list. In this way, a net list according to which a layout procedure is simplified can always be produced.

15 Claims, 11 Drawing Sheets

LOGIC SYNTHESIZER

BACKGROUND OF THE INVENTION

1. Field of the Invention

The present invention relates to a logic synthesizer which is for producing a net list which contains information about logic elements consisting of macro cells and designed so as to put significance upon layout simplicity and about connection among them.

2. Description of the Prior Art

FIG. 12 is a block diagram showing an architecture of a prior art logic synthesizer. As shown in FIG. 12, a logic synthesizer 1 takes in a logic function description defining conditions of logic connections from a function description file 5. The function description file 5 is a file which contains logic function description where circuit functions of the logic synthesizer desired by the user are described in HDL (Hardware Description Language).

The logic synthesizer converts the logic function description received from the function description file 5 into a logic such as AND, OR, etc., and it further compresses the logic to produce the optimum logic formula D1 to an optimizing unit 2.

The optimizing unit 2 takes in the logic formula D1 and restricting requirements D7 to a user desired Circuit property described in a restricting requirements file 7. The circuit property herein means a property pertaining to operation velocity, circuit area, demand, etc. In order to gain the circuit property satisfying the restricting requirements D7, the optimizing unit 2 uses macro cells registered in a macro cell library 6 and produces a net list D2 for implementing the logic formula D1 to output it to a fan out regulating unit 3. The macro cells are logic function blocks which are designated and registered in the macro cell library 6 in advance by the user. The net list D2 defines information about logic elements consisting of the macro cells and information about connections among them.

The fan out regulating unit 3 takes in the net list D2, and each macro cell in the net list D2 changes the net list D2 so as to meet fan out restricting requirements registered in the macro cell library 6 and outputs a net list D3 to a timing regulating unit 4.

After taking in the net list D3, the timing regulating unit 4, similar to the fan out regulating unit 3, regulates a timing of a set up time and hold time of a flip flop to change the net list D3 and produces an ultimate net list D4.

Based upon the net list D4, an existing layout unit performs a layout (layout wiring) procedure for macro cells, and consequently, a logic circuit consisting of macro cells is fabricated.

FIG. 13 is a schematic diagram showing an exemplary layout of macro cells based upon a net list produced by the prior art logic synthesizer (that which is equivalent to the net list D4 in FIG. 1). As shown in FIG. 13, a macro cell (layout) train 8 (consisting of trains 8a, 8b and 8c herein) contain macro cells 10 (10a through 10c, 10d through 10f, 10g through 10i) arranged in the respective trains.

The macro cells 10b and 10d have their respective feedthroughs 11b and 11d, and none of the remaining ones of the macro cells 10 has a feedthrough 11. "Feedthrough" is defined as a wiring traversing region which lies in a macro cell.

Wiring regions 9a and 9b are provided between the macro cell trains 8a and 8b, and 8b and 8c, respectively, and cell connecting wirings 12 (12a through 12d herein) are further provided in the wiring regions 9 to implement a connection between separate macro cells 10.

The prior art logic synthesizer is likely to use, in many cases, macro cells having a small number of or no feedthroughs in designing and structuring a combination circuit because it produces a net list, putting significance upon optimizing a circuit area and an operation velocity. Thus, it is probable that the prior art logic synthesizer produces a net list requiring to have a small number of feedthroughs.

When a logic circuit is structured based upon a net list requiring to have the small total number of feedthroughs, cell connecting wirings formed in a roundabout route in the wiring regions 9 increase in number like a cell connecting wiring 12c connecting between the macro cells 10b and 10h in FIG. 13. As a result, a large wiring load is charged as well as adverse effects such as lack of the intended delay property, etc., are caused; in the worst case, there arises the problem that wirings are left unconnected, and it is impossible to do layout.

Thus, the prior art logic synthesizer has the disadvantage that it produces no net list suitable for a layout procedure.

SUMMARY OF THE INVENTION

According to the present invention, a logic: synthesizer comprises logic function description applying means for applying a logic function description which defines conditions of logic connections; net list generating means receiving the logic function description for generating a net list which defines element information about logic elements comprised of macro cells and connection information about connections of them, based upon the logic function description; and layout simplifying means receiving the net list, evaluating as GOOD or NO GOOD a layout aptitude of a logic circuit comprised of the macro cells defined the net list based upon a predetermined reference, and replacing the macro cells defined by the net list with alternative ones without changing a logic of the whole logic circuit when the layout aptitude is evaluated as NO GOOD, for producing a net list according to which the layout aptitude is evaluated as GOOD.

Preferably, the layout simplifying means comprises layout aptitude evaluating means receiving the net list, and calculating an evaluation value related to the number of feedthroughs of the logic circuit comprised of the macro cells defined by the net list, for evaluating as GOOD or NO GOOD the layout aptitude based upon the evaluation value; and macro cell replacing means receiving a NO GOOD net list according to which the layout aptitude is evaluated as NO GOOD by the layout aptitude evaluating means, and replacing the macro cells defined by the NO GOOD net list with alternative ones without changing a logic of the whole logic circuit, for producing a net list according to which the layout aptitude is evaluated as GOOD.

Preferably, the evaluation value is a ratio of the total number of feedthroughs, FN, of all the macro cells defined by the net list, to the total number of input units, PN1, of all the logic elements defined by the net list, that is, (FN/PN1); and the layout aptitude evaluating means evaluates the layout aptitude as GOOD when the ratio (FN/PN1) is equal to or over a specified value, or as NO GOOD when it is under the specified value.

Preferably, each of the macro cells is structured as a combination of pairs of transistors; the evaluation value is a ratio of the difference between the total number of the transistor pairs, TN, of all the macro cells defined by the net list and the total number of input/output units, PN01, of all the logic elements defined by the net list, that is, (TN−PN01), to the total number of input units, PN1, of all the logic elements defined by the net list, that is, ((TN−PN01)/PN1); and the layout aptitude evaluating means evaluates the layout aptitude as GOOD when the ratio ((TN−PN01)/PN1) is equal to or over a specified value, or as NO GOOD when it is under the specified value.

Preferably, each of the macro cells is structured as a combination of pairs of transistors, where a specified number of the transistor pairs is defined as a single circuit gate; the evaluation value is a ratio of the total number of circuit gates, GN, of all the macro cells defined by the net list to the total number of input units, PN1, of all the logic elements defined by the net list, that is, (GN/PN1); and the layout aptitude evaluating means evaluates the layout aptitude as GOOD when the ratio (GN/PN1) is equal to or over a specified value, or as NO GOOD when it is under the specified value.

Preferably, the replacing of the macro cells by the macro cell replacing means is a process of determining a macro cell to be replaced and replacing the macro cell with a macro cell having a larger number of feedthroughs.

Preferably, the macro cell replacing means includes replaced macro cell determining means expecting the optimum formation of macro cells based upon the net list for determining the macro cell to be replaced at each specified macro cell interval in a row of the macro cells arranged in the expected optimum formation.

Preferably, the logic synthesizer further comprises a macro cell library storing information about particulars of macro cells which contains at least the number of feedthroughs of the macro cells; the layout aptitude evaluating means makes a reference to the macro cell library to find the evaluation value; and the macro cell replacing means makes a reference to the macro cell library to perform the replacing of the macro cells.

Preferably, the macro cell library stores information about various macro cells identical in logic function and circuit property and different only in the number of feedthroughs; and the replacing of the macro cells by the macro cell replacing means is a process of replacing the macro cell to be replaced with a macro cell identical in logic function and circuit property and larger only in the number of feedthroughs.

Preferably, the macro cell library stores information about various macro cells identical in logic function and different in the number of feedthroughs; and the replacing of the macro cells by the macro cell replacing means is a process of replacing the macro cell to be replaced with a macro cell identical in logic function and larger in the number of feedthroughs.

Preferably, the macro cell library stores information about various macro cells different in logic function and the number of feedthroughs; and the replacing of the macro cells by the macro cell replacing means is a process of replacing the macro cell to be replaced with a macro cell different in logic function and larger in the number of feedthroughs without changing a logic of the whole logic circuit defined by the net list.

Preferably, the circuit property is a property containing an operation velocity, a formation area, and a demand of each logic element comprised of macro cells.

Preferably, the net list generating means comprises logic formula generating means receiving the logic function description for producing a logic formula based upon the logic function description; and net list producing means receiving the logic formula and making a reference to the macro cell library for producing the net list based upon the logic formula so that the circuit property, a fan out condition, and a timing condition meet their respective specified requirements.

The layout simplifying means of the logic synthesizer of the first feature of the present invention receives a net list generated by the net list generating means, evaluates as GOOD or NO GOOD a layout aptitude of a logic circuit comprised of macro cells required by the net list based upon a specified reference, replaces macro cells with alternative ones without changing a logic of the whole logic circuit when the layout aptitude is evaluated as NO GOOD, and produces a net list according to which the layout aptitude is evaluated as GOOD. Thus, even if the net list generated by the net list generating means is NO GOOD, the layout simplifying means always outputs a net list having GOOD layout aptitude.

Specifically, the layout aptitude evaluating means the second feature of the present invention evaluates the layout aptitude as GOOD or NO GOOD based upon an evaluation value related to the number of feedthroughs of a logic circuit comprised of macro cells required by the net list. The evaluation value is used because a wiring process which is part of a layout procedure is more simplified as the number of feedthroughs increases.

Further specifically, as the third feature of the present invention employed as the evaluation value is a ratio of the total feedthroughs of all the macro cells required by the net list, FN, to the total number of input units of all the logic elements required by the net list, PN1, that is, (FN/PN1). The evaluation value is used for the following reasons: an increase in the number of wirings with increasing the total number of input units, PN1, prevents the layout from being simplified. An increase in the number of feedthroughs promotes layout simplifying.

Accordingly, it is an object of the present invention to provide a logic synthesizer which produces a net list according to which a layout procedure can be simplified.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram showing an example of a net list the layout simplifying unit in FIG. 1 takes in;

DETAILED DESCRIPTION OF THE PREFERRED EMBODIMENT

Figure 1:
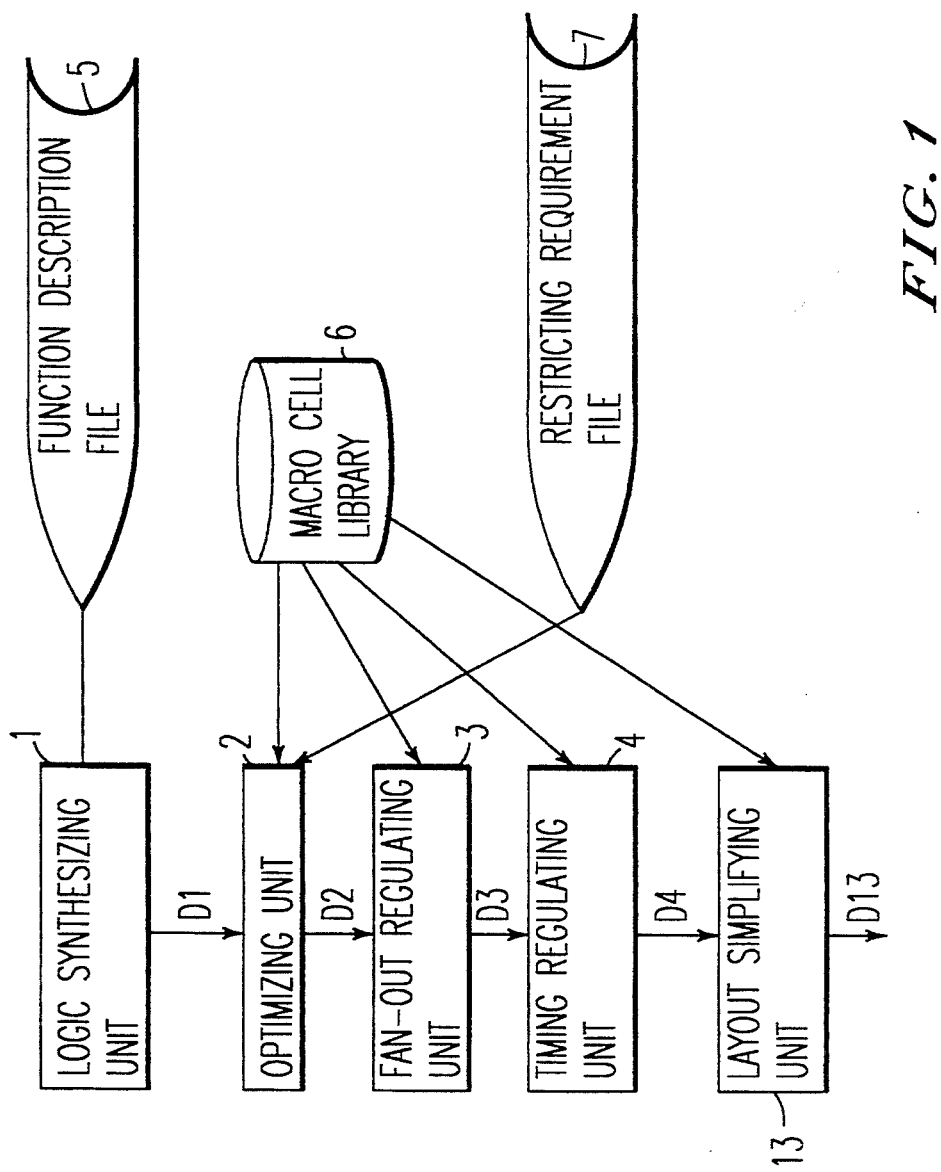
FIG. 1 is a block diagram illustrating an architecture of a logic synthesizer of a preferred embodiment according to the present invention.
Figure 12:
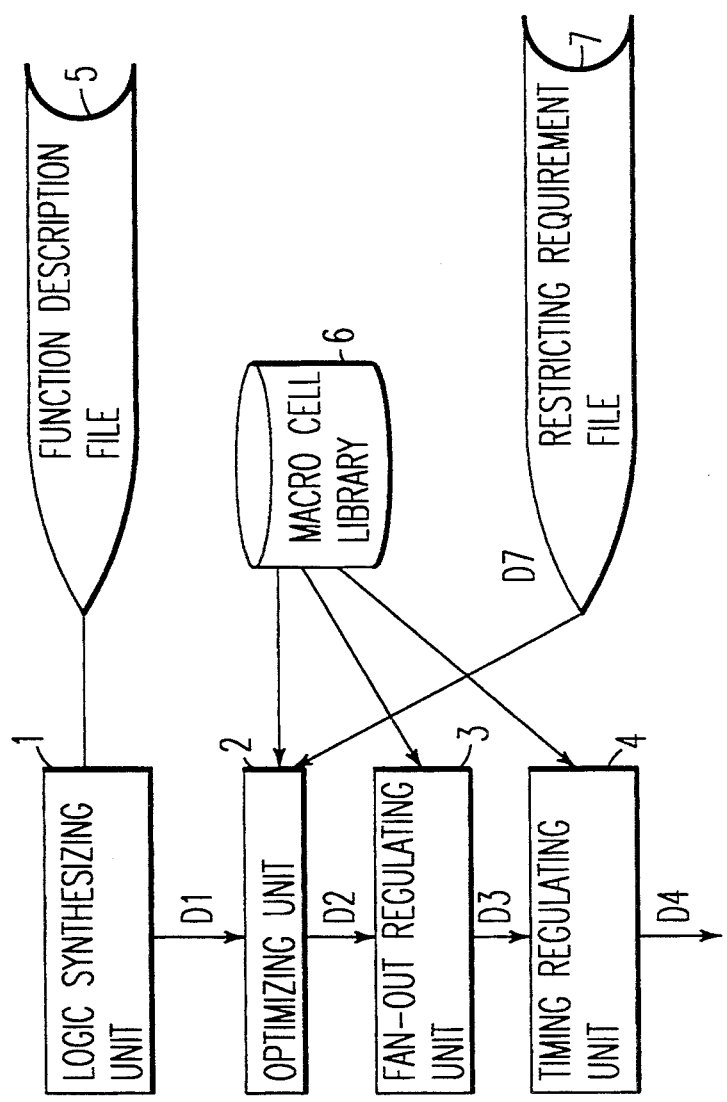
FIG. 12 is a block diagram illustrating an architecture of a prior art logic synthesizer.
Figure 13:
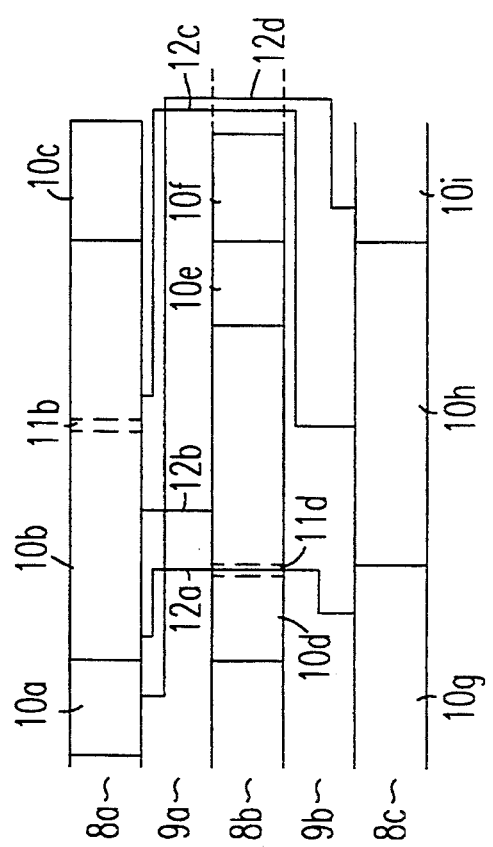
FIG. 13 is a diagram showing an exemplary layout of a net list generated in the logic synthesizer in FIG. 12.

FIG. 1 is a block diagram illustrating an architecture of a logic synthesizer of a preferred embodiment according to the present invention. As shown in FIG. 1, a timing regulating 4 is followed by a layout simplifying unit 13 newly provided in its next stage. The layout simplifying unit 13 takes a net list D4 received from the timing regulating unit 4 to evaluate a layout aptitude in the net list D4. If the layout aptitude is no good, it is conducted to make a reference to a macro cell registered in a macro cell library and replace the macro cell to change the net list D4, so that a net list D13 having a good layout aptitude may be produced. Other components are similar to those shown in FIG. 12, and therefore, the description of then is omitted.

Figure 2:
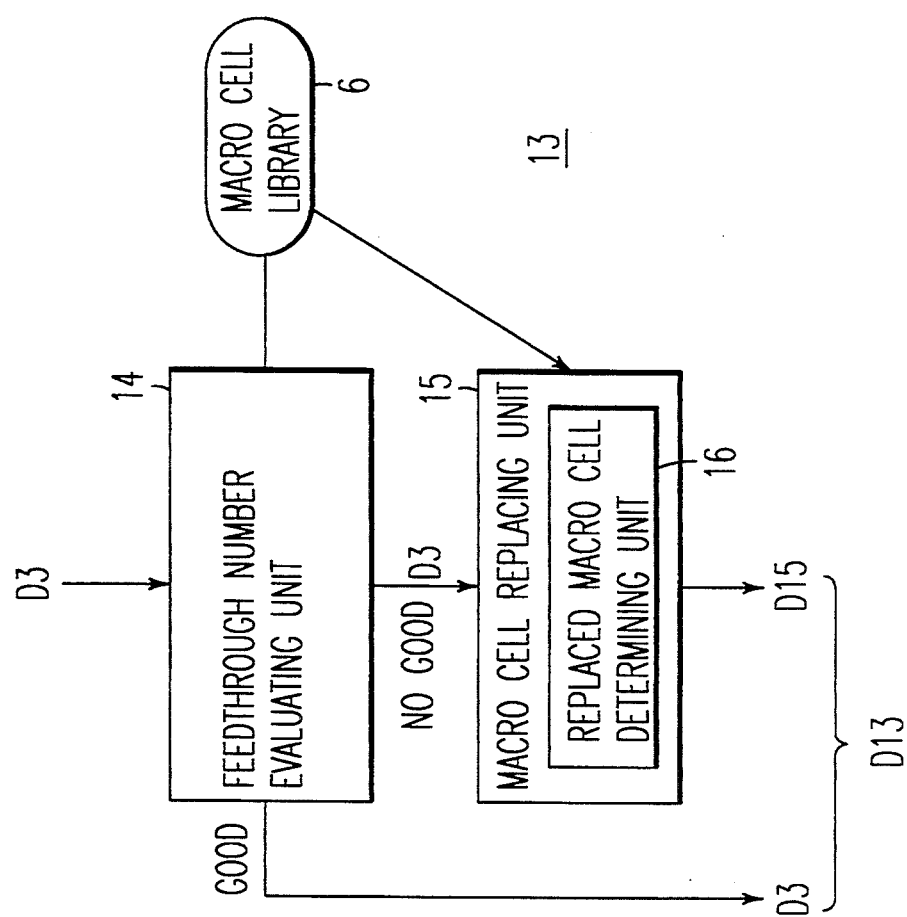
FIG. 2 is a block diagram illustrating specifics of a layout simplifying unit in FIG. 1.

FIG. 2 is a block diagram illustrating an internal architecture of the layout simplifying unit 13. The layout simplifying unit 13 consists of a feedthrough figure evaluating unit 14 and a macro cell replacing unit 15.

Receiving a net list D3, the feedthrough number evaluating unit 14 makes a reference to the macro cell library 6 to calculate the total number of feedthroughs, FN, and evaluate a layout aptitude, good or no good, based upon the total number of feedthroughs FN. With an evaluation of GOOD, the feedthrough number evaluating unit 14 produces the net list D3 unchanged at all as a net list D13 while with an evaluation of NO GOOD, it delivers the net list D3 to the macro cell replacing unit 15. The macro cell replacing unit 15 replaces the macro cell having a small number (including 0) of feedthroughs with the one having a larger number of feedthroughs until the total number of feedthroughs, FN, according to which the evaluation GOOD can be given is satisfied in the net list D3, so as to change the net list D3, and then, it produces a net list D15 having a good layout aptitude as the net list D13.

At this time, a replaced macro cell determining unit 16 contained by the macro cell replacing unit 15 determines a macro cell to be replaced with an alternative macro cell having a larger number of feedthroughs.

Figure 3:
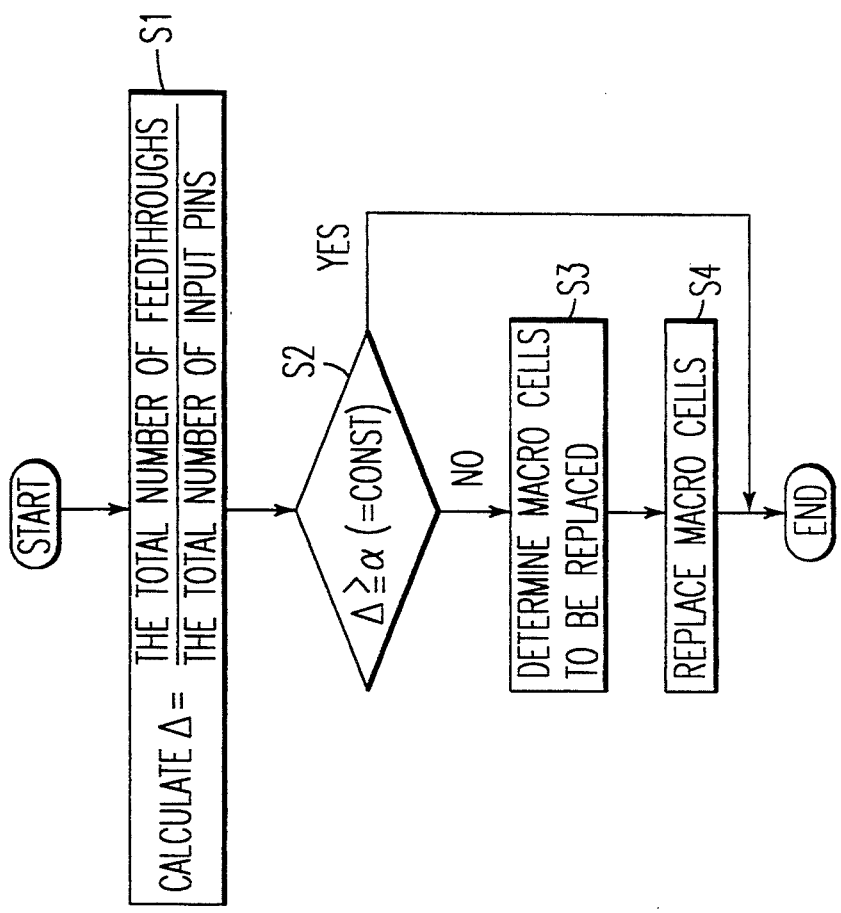
FIG. 3 is a flow chart illustrating the operation of the layout simplifying unit in FIG. 1.
Figure 4:
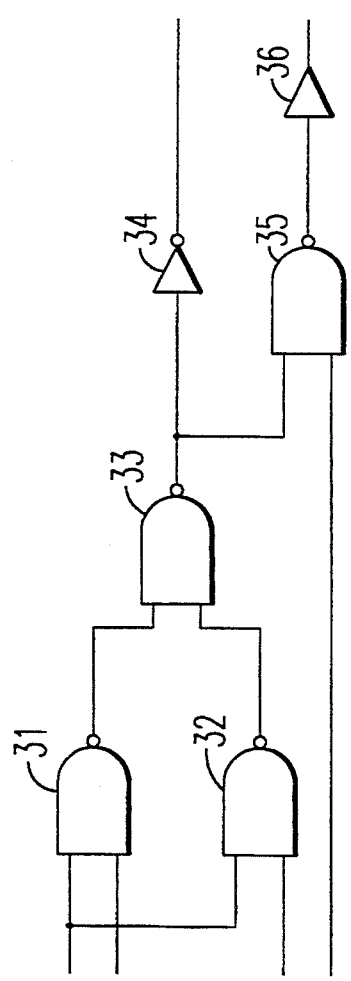

FIG. 3 is a flow chart illustrating the processing in the layout simplifying unit 13. FIG. 4 is a circuit diagram showing an example of the net list D3.

As shown in FIG. 4, the net list D3 includes element information about logic elements 31 through 36 and connection information about them. The element information about each of the logic elements 31 through 36 includes logic information about AND, OR, etc. and macro cell identifying symbols constituting logic elements. For example, although an NAND gate 31 and an NAND gate 35 have the same logic information, respectively, they do not necessarily use the same kinds of macro cells; they sometimes use macro cells different in circuit property and the number of feedthroughs from each other. In this case, the NAND gate 31 has different macro cell identifying symbols from those of the NAND gate 35. The circuit property mentioned herein is a property related to driving capability, operation velocity, circuit area, demand, etc. Circuit information about circuit property, the number of feedthroughs, etc. are stored in the macro cell library 6 corresponding to macro cell identifying symbols.

Thus, the number of input pins of each logic element can be obtained through the connection information contained by the net list D3, and the number of feedthroughs of each logic element can be obtained by referring to the macro cell library 6 based upon the macro cell identifying symbols in the net list D3.

The processing of the layout simplifying unit 13 will be described with reference to FIG. 3.

First, at Step S1, the feedthrough evaluating unit 14 finds the total number of feedthroughs, FN, of all the macro cells in the net list D3 from the net list D3 and the macro cell library 6 and finds the total number of input pins, PN1, of all the logic elements in the net list D3.

Then, the evaluation value $\Delta$ is found according to the formula below:

$$\Delta = \text{(the total number of feedthroughs, FN)/(the total number of input pins, PN1)} \quad (1)$$

As can be seen, the reason why the total number of input pins, PN1, is used as the denominator of a fraction expressing the evaluation value $\Delta$ is that the larger the total number of input pins, PN1, the larger the total number of feedthroughs, FN, should be to attain a good layout aptitude because the total number of input pins of all the logic elements in the net list D3 is equivalent to the total number of nets to be connected. Then, at Step S2, the feedthrough number evaluating unit 14 compares the evaluation value $\Delta$ with a comparison coefficient $\alpha$ (constant). If $\Delta \geq \alpha$, it is considered that there already exists the total number of feedthroughs, FN, according to which the evaluation GOOD is given to a layout aptitude in a formation of the net list D3 to produce the net list D3 without change as a net list D13, and the processing is completed.

On the other hand, if $\Delta < \alpha$, it is considered that the evaluation NO GOOD is given to the layout in the formation of the net list D3, and the routine proceeds to Step 3.

At Step S3, the replaced macro cell determining unit 16 in the macro cell replacing unit 15 determines a macro cell to be replaced with the one having a larger number of feedthroughs. A procedure of determination as stated above will be described in-detail in context of the net list D3 shown in FIG. 4.

Figure 5:
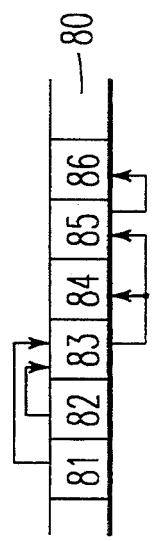
FIG. 5 is a diagram illustrating an exemplary formation of the net list in FIG. 4.

In the case of the net list D4 illustrated in FIG. 4, if the logic elements 31 through 36 are formed of macro cells 81 through 86, respectively, the macro cells 81 through 86 are efficiently disposed adjacent to each other in a cell train 80 as shown in FIG. 5 because of conditions of input/output connections of the logic elements 31 through 36.

Allowing for this, it can be estimated that an existing layout device probably has the macro cells 81 through 86 disposed as illustrated in FIG. 5. Now in a circuit in the net list D3, for example, as three more feedthroughs must be added in the cell train 80 to gain a good layout aptitude, the macro cells 81, 83 and 85 are determined to be replaced. This is because providing feedthroughs at adequate macro cell intervals is far more excellent in wiring efficiency than forming feedthroughs between adjacent macro cells.

Thus, the replaced macro cell determining unit 16 in the macro cell replacing unit 15 estimates the optimum formation of macro cells based upon the net list D3 and then determines the macro cells to replace with alternative ones so that the macro cells in an estimated formation can be replaced with the ones having a larger number of feedthroughs at adequate macro cell intervals.

At Step S4, the macro cell replacing unit 15 replaces the macro cells which the replaced macro cell determining unit 16 determines to be replaced with alternative ones, with the ones having a larger number of feedthroughs. The macro cell replacing will be described in detail below.

Figure 6:
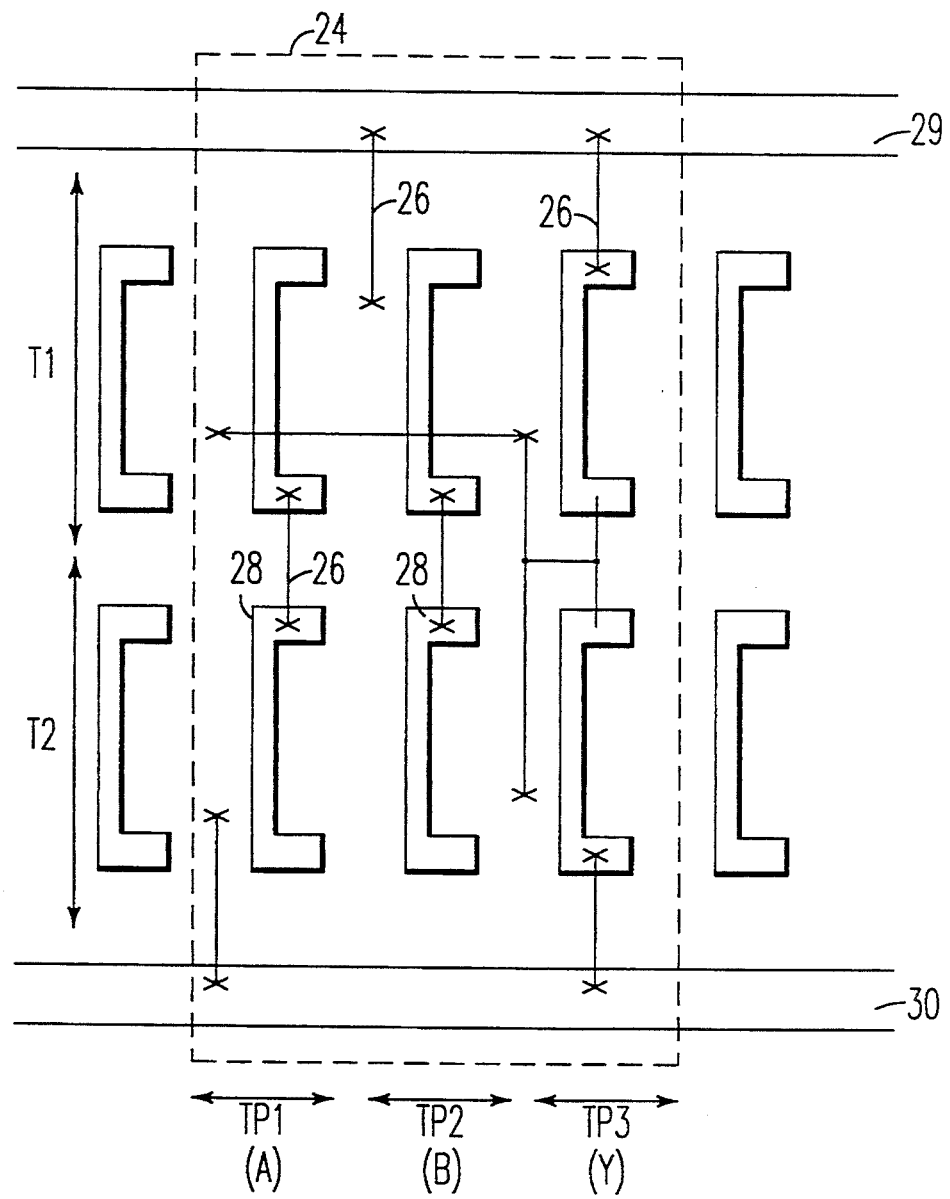
FIG. 6 is a diagram illustrating an exemplary arrangement of a macro cell constituting a two-input NAND gate.
Figure 7:
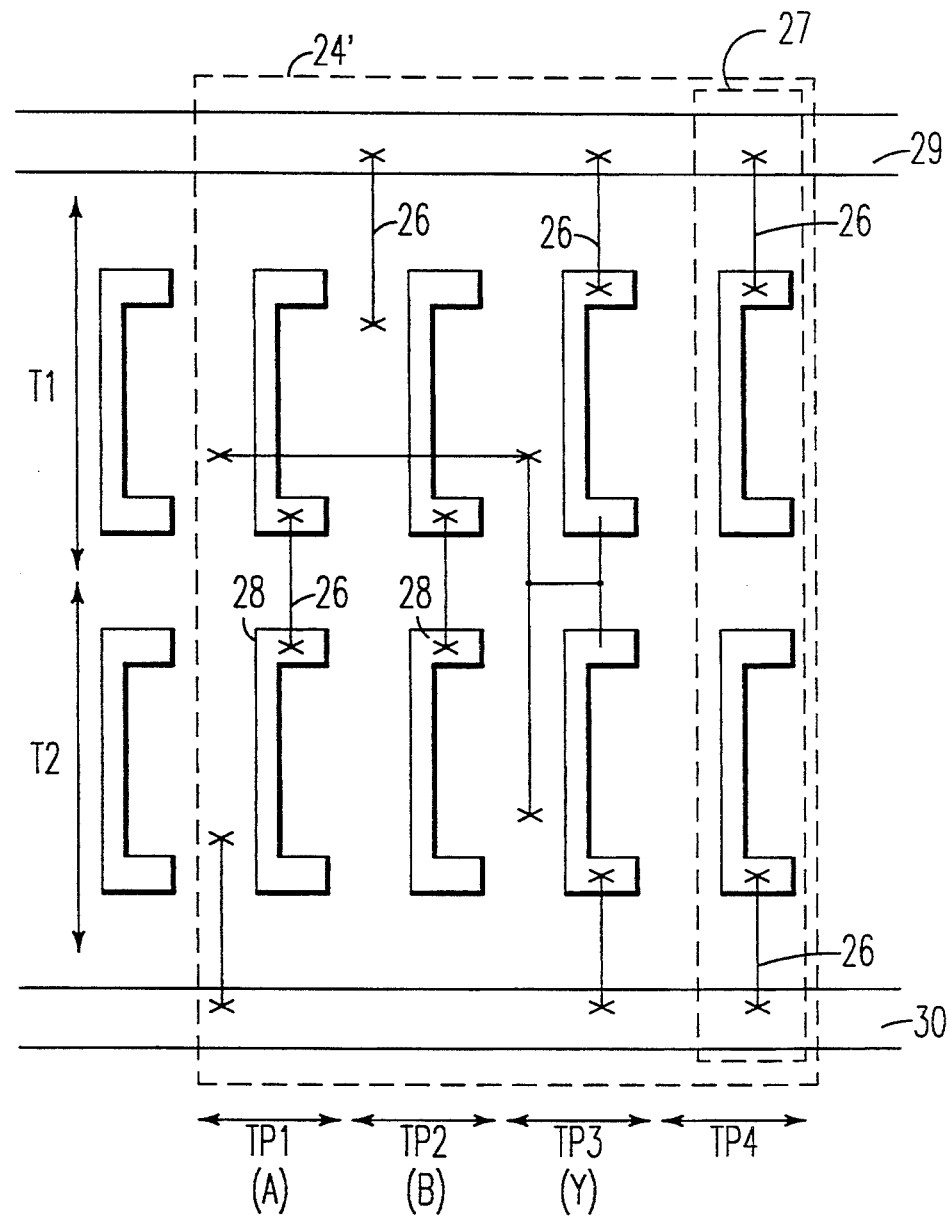
FIG. 7 is a diagram illustrating an exemplary arrangement of a two-input NAND gate.

FIGS. 6 and 7 are diagrams illustrating a model of a macro cell constituting a two-input NAND gate. In FIGS. 6 and 7, reference numerals 24 and 24' denote macro cells constituting NAND gates, respectively. The macro cell 24 uses three pairs of transistors, TP1 to TP3, in each of which a transistor formed in a region T1 and a transistor formed in a region T2 are mated, so as to constitute a NAND gate. Similarly, the macro cell 24' uses three pairs of transistors TP1 to TP3 to constitute a NAND gate, and it further includes a pair of transistors, TP4, having no logic function at all.

As will be recognized, although the macro cell 24' is different from the macro cell 24 simply in that it includes the extra transistor pair TP4, its logic elements and circuit property are completely the same with the macro cell 24.

Reference numeral 28 denotes a gate electrode of the transistors, numeral 26 denotes wirings for constituting a NAND gate (but the wiring 26 in the transistor pair TP4 is not used for constituting the NAND gate), and numeral 27 denotes a feedthrough forming region. Moreover, reference numeral 29 denotes power source wiring layer and numeral 30 denotes a ground wiring layer.

The Two-input NAND gate of the macro cell 24 or 24' structure as mentioned above, although not illustrated in detail, includes the transistor pairs TP1 and TP2 having two input pins A and B at their respective gate inputs and the transistor pair TP3 having an output pin Y at its drain output.

Wiring of a macro cell usually utilizes first and second wirings formed in different layers from each other; the first wiring is used for wiring in the macro cell 24 (or 24') while the second wiring is used for wiring with the input pins A and B and the output pin Y. The second wiring is also used for wiring passing the feedthroughs.

Thus, the transistor pairs TP1 to TP3 in the macro cell 24 and the transistor pairs TP1 to TP3 in the macro cell 24' utilize the first and second wirings, and therefore, there is no room for forming feedthroughs using the second wiring. On the other hand, the transistor pair TP4 in the macro cell 24' needs no input and output pins, and since the internal wirings 26 to the power source wiring 29 and the ground wiring 30 are formed of the first wiring, the feedthroughs can be formed by the second wiring.

For the above reasons, when the macro cell 24 (the number of feedthroughs=0) constituting the NAND gate shown in FIG. 6 is the one to be replaced, the macro cell 24 is replaced with the macro cell 24' (the number of feedthroughs=1) in FIG. 7 to increase the feedthroughs in number.

In this way, a macro cell which is determined to be replaced is replaced with an alternative macro cell identical in structure but having an extra feedthrough region provided, so that replacement of a macro cell can be performed by only increasing feedthroughs in number without changing circuit property such as driving capability, delay time, demand, etc., as well as a logic element which is comprised of the macro cell.

However, the macro cell which has only the extra feedthrough region provided is not generally used and must be specially prepared.

Usually, there are several sorts of macro cells constituting the same logic element because of necessity for a variety of circuit properties, and the various macro cells are generally different in the number of feedthroughs from one another. Hence, a macro cell to be replaced may be replaced with a macro cell having a larger number of feedthroughs but constituting an identical logic element. In this case, although there is the disadvantage that the circuit property is changed, it is not necessary to specially prepare a macro cell where a feedthrough region alone is superfluously provided.

Figure 8:
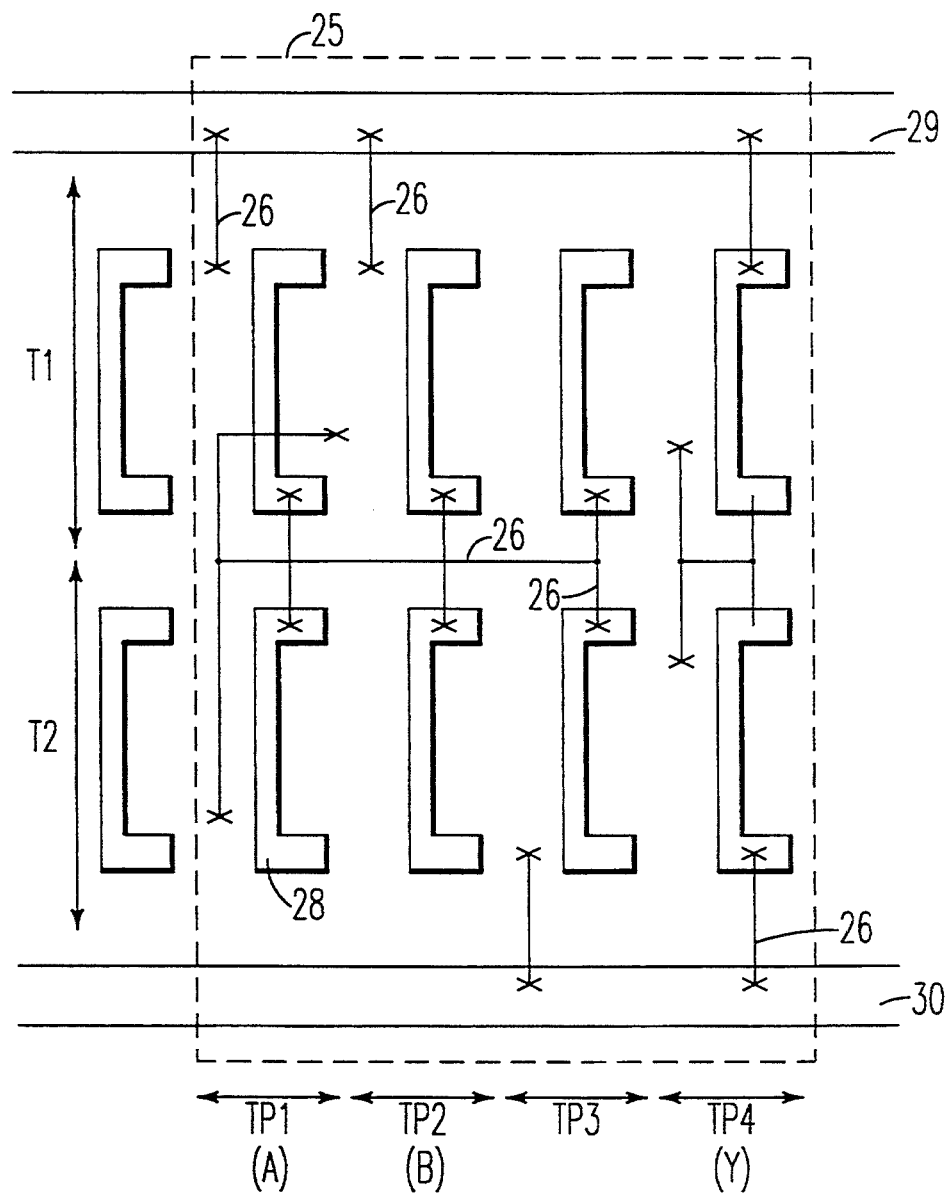
FIG. 8 is a diagram illustrating an exemplary arrangement of a two-input NAND gate.

Also, in general, a two-input AND gate includes more transistor pairs than a two-input NAND gate, and accordingly, feedthroughs are increased in number. FIG. 8 is a diagram illustrating an exemplary macro cell constituting a two-input AND gate.

As shown in FIG. 8, the two-input AND gate is comprised of four pairs of transistors, TP1 through TP4, in each of which a transistor formed in a region T1 and a transistor formed in a region T2 are mated. Reference numeral 28 denotes a gate electrode of a transistor, numeral 26 denotes wiring for constituting the AND gate, numeral 29 denotes a power source wiring layer, and numeral 30 denotes a ground wiring layer.

The two-input AND gate structure as mentioned above, although not illustrated in detail, has two input pins A and B at a gate input of each of the transistor pairs TP1 and TP2 and has an output pin Y at a drain output of the transistor pair TP4. Thus, the transistor pair TP3 has no input and output pins. Moreover, every wiring 26 connected to the transistor pair TP3 is formed of first wiring. Since there is no adverse effect even if second wiring is formed in a transistor pair TP3 forming region, a feedthrough is formed in this region.

If the two-input NAND gate shown in FIG. 6 is a macro cell to be replaced with alternative one, the above-mentioned characteristic can be utilized to replace a macro cell by changing the two-input NAND gate for the two-input AND gate having a larger number of feedthroughs without changing a logic of the whole circuit.

Figure 9:
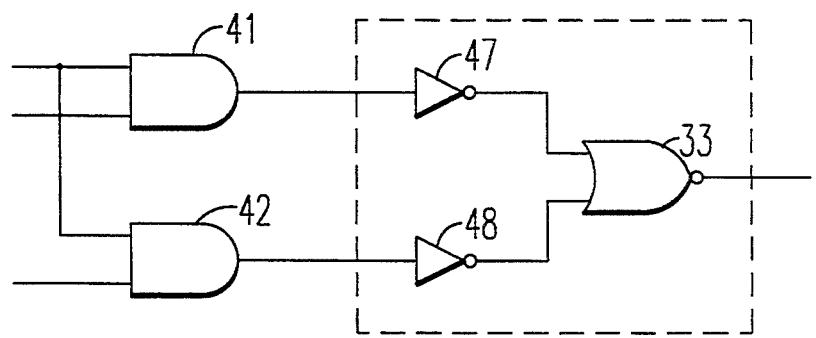
FIG. 9 is a circuit diagram illustrating an example where macro cells are replaced with alternative ones.
Figure 10:
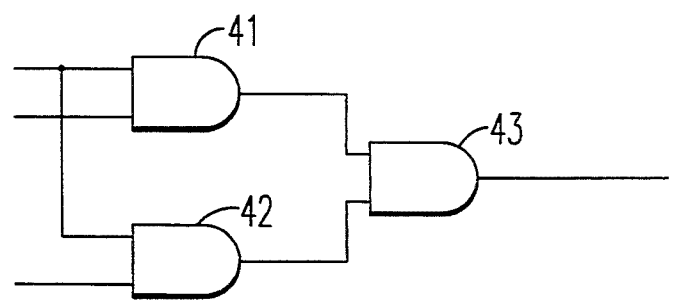
FIG. 10 is a circuit diagram illustrating an example where macro cells are replaced with alternative ones.

For example, FIG. 9 shows a simple variation where NAND gates 31 and 32 shown in FIG. 4 are changed for AND gates 41 and 42, respectively. Reference numerals 47 and 48 in FIG. 9 designate an inverter. However, newly providing the inverters 47 and 48 in the structure shown in FIG. 9 results in the total number of input pins, PN1, accordingly increasing by two. In order to correct this situation, the inverters 47, 48 and a NOR gate 33 (all of them are enclosed by broken line) are replaced with a single AND gate 43. Eventually, as shown in FIG. 10, the NAND gates 31, 32 and NOR gate 33 are replaced with the AND gates 41, 42 and 43, respectively, without changing the total number of the input pins, PN1.

In this way, a macro cell to be replaced one can be replaced with a macro cell having a larger number of feedthroughs and different in logic without changing a logic of the whole circuit.

Figure 11:
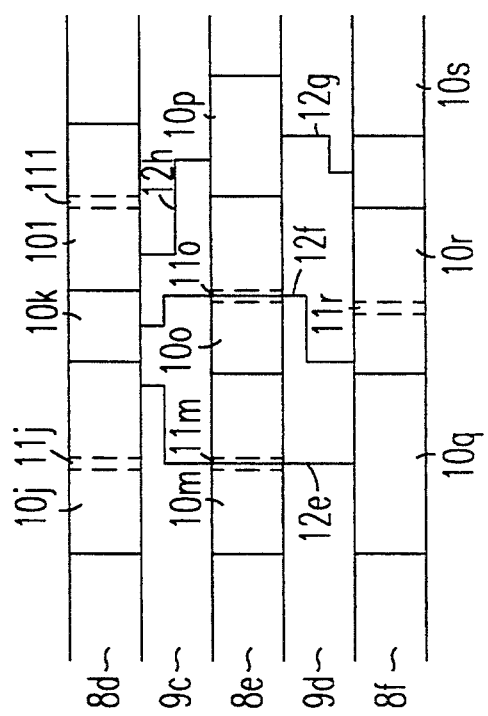
FIG. 11 is a diagram illustrating an exemplary layout based upon a net list which is generated in the logic synthesizer in FIG. 1.

As has been described, the net list D13 produced by the layout simplifying unit 13 always contains the total number of feedthroughs at a level where an evaluation GOOD is given to an layout aptitude. This is why an efficient layout as shown in FIG. 11 can be implemented without a wiring left non-connected and without a wiring taking a roundabout route between cells if an existing layout unit conducts a layout procedure based upon the net list D13. In FIG. 11, alphanumeric characters 8d through 8f denote trains of macro cells, characters 9c and 9d denote wiring regions, characters 10j through 10s denote macro cells, characters 11j, 11l, 11n, 11o and 11r denote feedthroughs, and characters 12e through 12g denote wirings between cells.

While the evaluation value $\Delta$ used at Step S2 is designated as FN/PN1, it should not be limited to this; otherwise it may be {(the total number of transistor pairs, TN)−(the total number of input/output pins, PN01)}/(the total number of input pins, PN1). This is based upon the property that the total number of feedthroughs, FN, is approximate to the difference between the total number of transistor pairs, TN, and the total number of input/output pins, PN01.

The evaluation value $\Delta$ may also be designated as (the number of circuit gates, GN)/(the total number of input pins, PN1). The number of circuit gates means the minimum number of transistor pairs required for forming a single basic logic element. For example, if the basic logic element is an NAND gate, three pairs of transistors makes a single circuit gate.

As described above, according to the present invention, a layout simplifying means evaluates a layout aptitude in a logic circuit consisting of macro cells determined in accordance with a net list as GOOD or NO GOOD, and if the layout aptitude is evaluated as NO GOOD, it performs a procedure to replace macro cells in the net list with alternative ones without changing a logic of the whole logic circuit to produce a new net list according to which an evaluation GOOD is given to a layout aptitude, so that a net list which simplifies a layout procedure can always be produced.

While the invention has been shown and described in detail, the foregoing description is in all aspects illustrative and not restrictive. It is therefore understood that numerous modifications and variations can be devised without departing from the scope of the invention.

What is claimed is:

1. A logic synthesizer comprising
   logic function description applying means for applying a logic function description which defines conditions of logic connections;
   net list generating means receiving said logic function description for generating a net list which defines element information about logic elements comprised of macro cells and connection information about connections of them, based upon said logic function description; and
   layout simplifying means receiving said net list, evaluating as GOOD or NO GOOD a layout aptitude of a logic circuit comprised of said macro cells defined by said net list based upon a predetermined reference, and replacing said macro cells defined by said net list with alternative ones without changing a logic of said whole logic circuit when said layout aptitude is evaluated as NO GOOD, for producing a net list according to which said layout aptitude is evaluated as GOOD.

2. A logic synthesizer, comprising:
   logic function description applying means for applying a logic function description which defines conditions of logic connections;
   net list generating means receiving said logic function description for generating a net list which defines element information about logic elements comprised of macro cells and connection information about connections of them, based upon said logic function description; and
   layout simplifying means receiving said net list, evaluating as GOOD or NO GOOD a layout aptitude of a logic circuit comprised of said macro cells defined by said net list based upon a predetermined reference, and replacing said macro cells defined by said net list with alternative ones without changing a logic of said whole logic circuit when said layout aptitude is evaluated as NO GOOD, for producing a net list according to which said layout aptitude is evaluated as GOOD;
   wherein said layout simplifying means comprises:
      layout aptitude evaluating means receiving said net list, and calculating an evaluation value related to a number of feedthroughs of said logic circuit comprised of said macro cells defined by said net list, for evaluating as GOOD or NO GOOD said layout aptitude based upon said evaluation value; and
      macro cell replacing means receiving a NO GOOD net list according to which said layout aptitude is evaluated as NO GOOD by said layout aptitude evaluating means, and replacing said macro cells defined by said NO GOOD net list with alternative ones without changing a logic of said whole logic circuit, for producing a net list according to which said layout aptitude is evaluated as GOOD.

3. A logic synthesizer according to claim 2, wherein each of said macro cells is structured as a combination of pairs of transistors, where a specified number of said transistor pairs is defined as a single circuit gate;
   said evaluation value is a rate of said total number of circuit gates, GN, of all said macro cells defined by said net list to said total number of input units, PN1, of all said logic elements defined by said net list, that is, (GN/PN1); and
   said layout aptitude evaluating means evaluates said layout aptitude as GOOD when said rate (GN/PN1) is equal to or over a specified value, or as NO GOOD when it is under said specified value.

4. A logic synthesizer according to claim 2, wherein each of said macro cells is structured as a combination of pairs of transistors; said evaluation value is a rate of said difference between said total number of said transistor pairs, TN, of all said macro cells defined by said net list and said total number of input/output units, PN01, of all said logic elements defined by said net list, that is, (TN−PN01), to said total number of input units, PN1, of all said logic elements defined by said net list, that is, ((TN−PN01)/PN1); and said layout aptitude evaluating means evaluates said layout aptitude as GOOD when said rate ((TN−PN01)/PN1) is equal to or over a specified value, or as NO GOOD when it is under said specified value.

5. A logic synthesizer according to claim 2, wherein said evaluation value is a rate of said total number of feedthroughs, FN, of all said macro cells defined by said net list, to said total number of input units, PN1, of all said logic elements defined by said net list, that is, (FN/PN1); and said layout aptitude evaluating means evaluates said layout aptitude as GOOD when said rate (FN/PN1) is equal to or over a specified value, or as NO GOOD when it is under said specified value.

6. A logic synthesizer according to claim 5, wherein said replacing of said macro cells by said macro cell replacing means is a process of determining a macro cell to be replaced and replacing said macro cell with a macro cell having a larger number of feedthroughs.

7. A logic synthesizer according to claim 6, wherein said macro cell replacing means includes replaced macro cell determining means expecting an optimum formation of macro cells based upon said net list for determining said macro cell to be replaced at each specified macro cell interval in a row of said macro cells arranged in said expected optimum formation.

8. A logic synthesizer according to claim 7, wherein said logic synthesizer further comprises a macro cell library storing information about particulars of macro cells which contains at least said number of feedthroughs of said macro cells;

said layout aptitude evaluating means makes a reference to said macro cell library to find said evaluation value; and said macro cell replacing means makes a reference to said macro cell library to perform said replacing of said macro cells.

9. A logic synthesizer according to claim 8, wherein said macro cell library stores information about various macro cells identical in logic function and circuit property and different only in said number of feedthroughs; and said replacing of said macro cells by said macro cell replacing means is a process of replacing said macro cell to be replaced with a macro cell identical in logic function and circuit property and larger only in said number of feedthroughs.

10. A logic synthesizer according to claim 9, wherein said circuit property is a property containing an operation velocity, a formation area, and a demand of each logic element comprised of macro cells.

11. A logic synthesizer according to claim 10, wherein said net list generating means comprises:

logic formula generating means receiving said logic function description for producing a logic formula based upon said logic function description; and net list producing means receiving said logic formula and making a reference to said macro cell library for producing said net list based upon said logic formula so that said circuit property, a fan out condition, and a timing condition meet their respective specified requirements.

12. A logic synthesizer according to claim 8, wherein said macro cell library stores information about various macro cells identical in logic function and different in said number of feedthroughs; and said replacing of said macro cells by said macro cell replacing means is a process of replacing said macro cell to be replaced with a macro cell identical in logic function and larger in said number of feedthroughs.

13. A logic synthesizer according to claim 8, wherein said macro cell library stores information about various macro cells different in logic function and said number of feedthroughs; and said replacing of said macro cells by said macro cell replacing means is a process of replacing said macro cell to be replaced with a macro cell different in logic function and larger in said number of feedthroughs without changing a logic of said whole logic circuit defined by said net list.

14. A logic synthesizer, comprising:

logic function description applying means for applying a logic function description which defines conditions of logic connections;

net list generating means receiving said logic function description for generating a net list which defines element information about logic elements comprised of macro cells and connection information about connections of them, based upon said logic function description; and layout simplifying means receiving said net list, evaluating as GOOD or NO GOOD a layout aptitude of a logic circuit comprised of said macro cells defined by said net list based upon a predetermined reference, and replacing said macro cells defined by said net list with alternative ones without changing a logic of said whole logic circuit when said layout aptitude is evaluated as NO GOOD, for producing a net list according to which said layout aptitude is evaluated as GOOD;

wherein said predetermined reference is a number of feedthroughs in said logic circuit.

15. A logic synthesizer, comprising:

logic function description applying means for applying a logic function description which defines conditions of logic connections;

net list generating means receiving said logic function description for generating a net list which defines element information about logic elements comprised of macro cells and connection information about connections of them, based upon said logic function description; and layout simplifying means receiving said net list, evaluating as GOOD or NO GOOD a layout aptitude of a logic circuit comprised of said macro cells defined by said net list based upon a predetermined reference, and replacing said macro cells defined by said net list with alternative ones without changing a logic of said whole logic circuit when said layout aptitude is evaluated as NO GOOD, for producing a net list according to which said layout aptitude is evaluated as GOOD;

wherein said layout simplifying means evaluates a connectivity layout aptitude, and replaces one of said macro cells defined by said net list with one of said alternative ones having a number of feedthroughs different than a number of feedthroughs in said one macro cell.

* * * * *